United States Patent [19]

Davidson

[11] Patent Number: 5,512,780
[45] Date of Patent: Apr. 30, 1996

US005512780A

[54] INORGANIC CHIP-TO-PACKAGE INTERCONNECTION CIRCUIT

[75] Inventor: Howard L. Davidson, San Carlos, Calif.

[73] Assignee: Sun Microsystems, Inc., Mountain View, Calif.

[21] Appl. No.: 303,466

[22] Filed: Sep. 9, 1994

[51] Int. Cl.⁶ .......................... H01L 23/495; H01L 23/48
[52] U.S. Cl. .......................... 257/668; 257/670; 257/671; 257/690
[58] Field of Search ...................... 257/668, 666, 257/690, 692, 671, 700, 672, 670, 716, 678, 731, 693

[56] References Cited

U.S. PATENT DOCUMENTS

| | | | |
|---|---|---|---|
| 4,180,828 | 12/1979 | Schermer et al. | 257/668 |
| 4,721,994 | 1/1988 | Mine et al. | 257/671 |
| 4,732,801 | 3/1988 | Joshi | 437/241 |
| 4,733,292 | 3/1988 | Jarvis | 257/670 |
| 4,805,420 | 2/1989 | Porter et al. | 257/716 |
| 5,036,163 | 7/1991 | Spielberger et al. | 257/697 |
| 5,105,259 | 4/1992 | McShane et al. | 257/796 |
| 5,343,074 | 8/1994 | Higgins | 257/668 |
| 5,362,985 | 11/1995 | Ma et al. | 257/697 |

FOREIGN PATENT DOCUMENTS

| | | | |
|---|---|---|---|
| 54-148379 | 11/1979 | Japan | 257/666 |
| 60-113950 | 6/1985 | Japan | 257/680 |
| 1310571 | 12/1989 | Japan | 257/671 |
| 4139868 | 5/1992 | Japan | 257/671 |

*Primary Examiner*—Sara W. Crane
*Assistant Examiner*—Jhihan Clark
*Attorney, Agent, or Firm*—Flehr, Hohbach, Test, Albritton & Herbert

[57] ABSTRACT

An inorganic chip-to-package interconnection circuit is described. The circuit has a set of electrical conductors that are held together by a set of insulating inorganic tie bars. The circuit constitutes a high-density chip-to-package interconnection circuit that does not absorb vapor or volatile gases. A variety of methods for forming the circuit are described. Advantageously, the methods utilize known processing techniques.

6 Claims, 5 Drawing Sheets

5,512,780

INORGANIC CHIP-TO-PACKAGE INTERCONNECTION CIRCUIT

BRIEF DESCRIPTION OF THE INVENTION

This invention relates generally to the packaging of semiconductor chips. More particularly, this invention relates to an inorganic chip-to-package interconnection circuit that is useful in sensitive packaging environments.

BACKGROUND OF THE INVENTION

There are a number of known techniques for making an electrical interconnection between a semiconductor chip and a semiconductor package. Tape-Automated Bonding (TAB) is one known technique for making such a chip-to-package interconnection. TAB uses an insulating polymer tape with a patterned metal to make a chip-to-package interconnection. The insulating tape is typically polyimide and the patterned metal is typically copper.

It is not feasible to use a TAB technique in conjunction with a sensitive packaging environment because water vapor and volatile gases are absorbed by the polymer tape during processing and handling. Thereafter, the water vapor and volatile gases can corrupt the sensitive packaging environment.

Any vacuum environment is a sensitive packaging environment. One use of a vacuum environment is in a cryogenic integrated circuit housing. As used herein, a cryogenic integrated circuit housing refers to any cooled volume that is evacuated and sealed. A cryogenic integrated circuit housing is used to reduce the operating temperature of an integrated circuit and thereby increase its operating speed.

Cryogenic integrated circuit housings endeavor to minimize all heat transfer paths. One way of accomplishing this goal is to use bond wires with very small diameters. The small diameter of the bond wire reduces thermal migration from the cooled chip environment, through the package feedthroughs, to the external pins of the package.

Unfortunately, this approach presents a major assembly problem for modern microprocessor chips that may have more than 400 external connections. It would be desirable to utilize a TAB-like approach to make connections to a cryogenically cooled semiconductor since a number of wires can be carried on a single polymer substrate. Unfortunately, as previously indicated, the polymer substrate absorbs vapor and volatile gases that are incompatible with a cyrogenically cooled package environment.

Therefore, it would be desirable to provide a high-density chip-to-package interconnection circuit that does not absorb vapor or volatile gases. Ideally, such a circuit would be formed by using processing techniques known in the art.

SUMMARY OF THE INVENTION

An inorganic chip-to-package interconnection circuit is described. The circuit has a set of electrical conductors that are held together by a set of insulating inorganic tie bars. The insulating inorganic tie bars are formed of an oxide and are positioned in a substantially perpendicular orientation in relation to the electrical conductors.

A variety of methods may be used to form the circuit. For example, the electrical conductors may initially be formed through an additive metal process. Thereafter, the tie bars may be formed in a subtractive process. Alternately, the electrical conductors may initially be formed in a subtractive metal process. In another embodiment, the tie bars are initially formed in an additive process and the electrical conductors are formed in a subtractive metal process.

The apparatus of the invention constitutes a high-density chip-to-package interconnection circuit that does not absorb vapor or volatile gases. Consequently it is advantageously used in sensitive packaging environments, such as cryogenically cooled semiconductor packages. The described methods of forming the chip-to-package interconnection circuit are readily implemented since they exploit known processing techniques.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
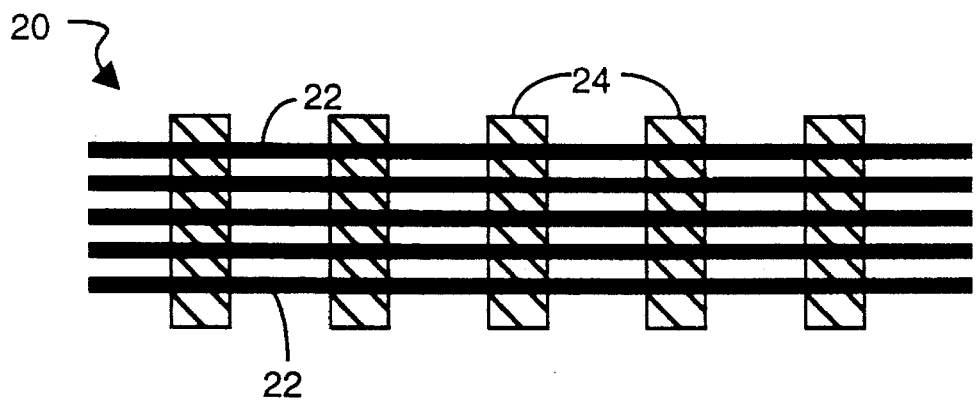
FIG. 1 is a plan view of the inorganic chip-to-package interconnection circuit of the invention.

FIG. 1 is a plan view of an inorganic chip-to-package interconnection circuit 20 in accordance with the present invention. The circuit 20 includes a set of electrical conductors 22 that are held together with a set of tie bars 24.

The electrical conductors 22 may be formed of any number of materials, including aluminum, titanium, copper, nickel, or alloys thereof. Typically, the electrical conductors 22 will be formed as a set of parallel lines. Typical conductor dimensions are between 15 and 35 microns, preferably approximately 25 microns, wide (top to bottom dimension in FIG. 1) and 0.5 to 25 microns, preferably approximately 18 microns, thick (dimension into FIG. 1). The spacing between each conductor 22 will typically be between 30 and 70 microns, preferably approximately 50 microns.

The tie bars 24 are formed of an insulating inorganic material. A low stress materials such as silicon dioxide, silicon nitride, or mixed oxide-nitride (oxynitride) is preferably used. Ordinarily, the tie bars will be between 25 to 50 microns thick (dimension into FIG. 1) and between 30 and 70 microns wide (left to right in FIG. 1).

Figure 2:
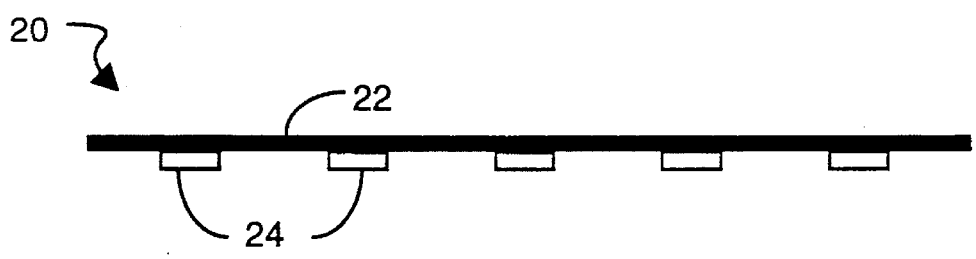
FIG. 2 is a side view of the inorganic chip-to-package interconnection circuit of the invention.
Figure 3:
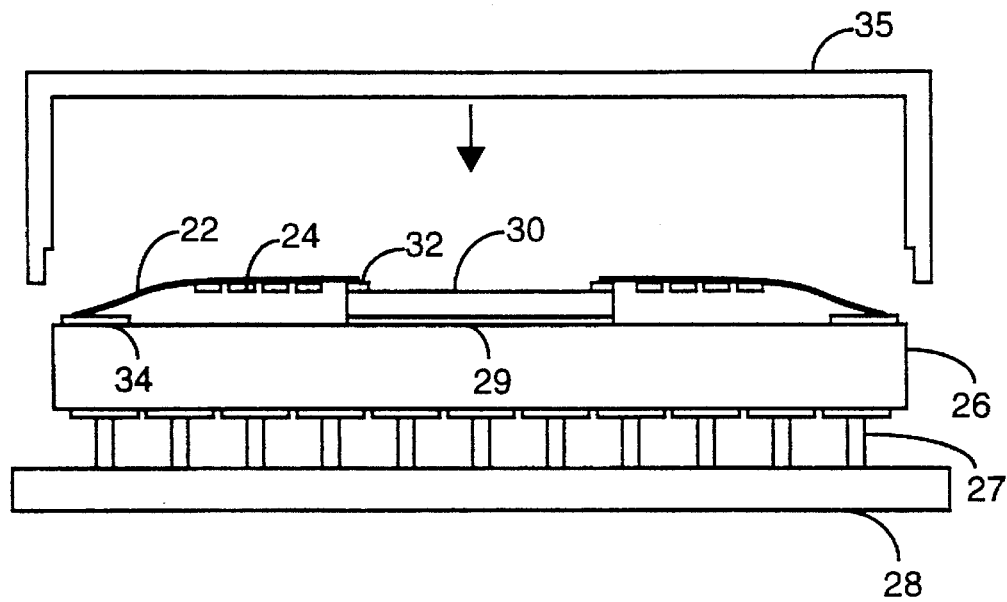
FIG. 3 is a cross-sectional view of the inorganic chip-to-package interconnection circuit of the invention being used to electrically connect a semiconductor chip with a semiconductor package.

FIG. 2 is a side view of the inorganic chip-to-package interconnection circuit 20. FIG. 3 is a cross-sectional view of the inorganic chip-to-package interconnection circuit 20 being used to electrically connect a semiconductor chip with a semiconductor package. Preferably, the package 26 includes hermetic feedthroughs (not shown) for connection with external pins 27 that are mounted in a printed circuit board 28 that forms, for example, a portion of a general purpose computer. A die attach 29 is used to connect a chip (die) 30 to the package 26. The electrical conductors 22 of the inorganic chip-to-package interconnection circuit 20 are attached to chip bond pads 32 of the package 26. Known thermocompression techniques associated with TAB may be used to realize this connection. Thus, the structure of the present invention is advantageous to the extent that it is utilized with conventional chip-to-package bonding technologies.

The opposite end of the inorganic chip-to-package interconnection circuit 20 is connected to package bond pads 34. Known thermocompression techniques may also be used to make this connection. Preferably, the package 26 forms a portion of a cryogenic integrated circuit housing. Thus, additional fixtures 35 will preferably be used to form a cooled volume around the die 30. Preferably, the cooled volume is evacuated and sealed.

Those skilled in the art will recognize a number of advantages associated with the structure of the present invention. Primarily, the inorganic chip-to-package interconnection circuit 20 provides a high-density chip-to-package interconnection circuit that does not absorb vapor or volatile gases. Consequently, it can be successfully employed in sensitive packaging environments such as cryogenically cooled semiconductor packages. The interconnection circuit 20 is also advantageous because standard bonding techniques may be used to form the chip-to-package bonds. Moreover, as will be described below, standard processing techniques may be used to form the circuit 20.

Figure 4:
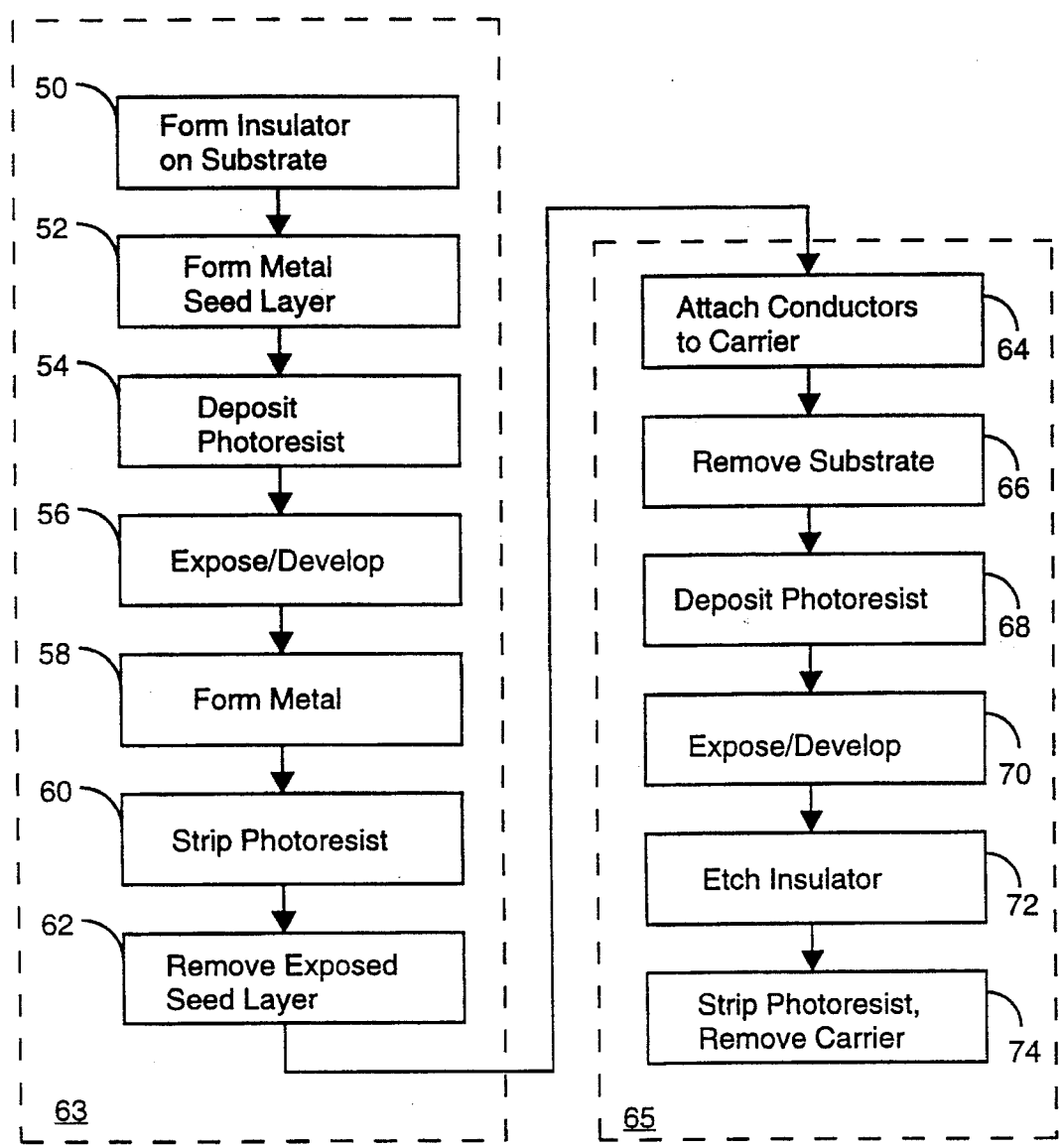
FIG. 4 illustrates processing steps that may be used to form the inorganic chip-to-package interconnection circuit of the invention.

FIG. 4 illustrates a set of processing steps that may be used to form an inorganic chip-to-package interconnection circuit 20 in accordance with the invention. The first step associated with the process is to form an insulator on a substrate (block 50). The substrate will typically be a semiconductor such as silicon. The insulator may be selected from such materials as silicon dioxide, silicon nitride, or mixed oxide-nitride (oxynitride). The film thickness will ordinarily be between 25 and 50 microns. The formation of the film may be achieved by plasma assisted low pressure chemical vapor deposition.

The next step is to form a metal seed layer (block 52). That is, a metal film is formed on top of the insulator film. A good way to do this is to sputter deposit a thin layer, say 200 nm, of an adherent metal such as titanium, followed by a thin layer of aluminum, copper, nickel, or other relatively unreactive metal.

Photoresist is then deposited on the metal seed layer (block 54). The photoresist is patterned to open windows where the conductors 22 are desired on the final circuit. The photoresist is then exposed and developed (block 56). This results in openings in the photoresist where the conductors 22 are to be formed.

Figure 5:
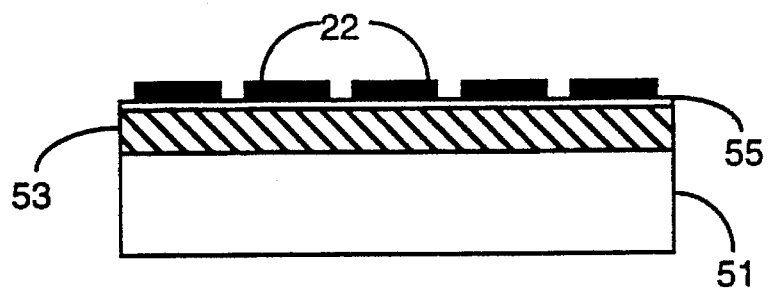
FIG. 5 illustrates the partially formed apparatus of the invention after processing at block 60 of FIG. 4.

Metal is then formed, for example by plating, in the opened windows (block 58) to construct conductors between 0.5 and 25 microns thick, preferably approximately 18 microns thick. Thereafter, the photoresist is stripped (block 60). This results in the structure in FIG. 5. The structure of FIG. 5 includes a silicon substrate 51 with an insulator 53 formed thereon. Conductors 22 are formed on the insulator 53 and the metal seed layer 55. The exposed portions of the seed layer (between the conductors 22) are then removed (block 62), for instance by etching.

The foregoing processing steps 50–62 form the conductors 22. These steps may be referred to as conductor formation steps 63. Note that these exemplary operations constitute an additive metal process. Note that the conductors 22 are formed on the insulator 53 which is formed on the silicon substrate 51.

The subsequent processing steps 64–72 form the tie bars 24. These steps may be referred to as tie bar formation steps 65. In the exemplary process of FIG. 4, the tie bar formation steps 65 constitute a subtractive process. The first step of the tie bar formation operation is to attach the conductors to a carrier (block 64), such as a silicon wafer. This may be accomplished with an adhesive, such as a removable film adhesive. This step facilitates handling of the conductor structure.

The next processing step is to remove the entire substrate (block 66), for instance by etching. This results in the electrical conductors 22 being attached only to a unitary insulating substrate 53 on one side and to a carrier on the opposite side.

The next processing step is to deposit photoresist (block 68) on the insulating substrate 53. The photoresist is used at this juncture to form the pattern for the tie bars. The photoresist is then exposed and developed (block 70). Thereafter, the insulator is etched (block 72) to form the tie bars 24. The photoresist is then stripped and the carrier is removed (block 74). This results in the inorganic chip-to-package interconnection circuit 20 of FIG. 1.

Figure 6:
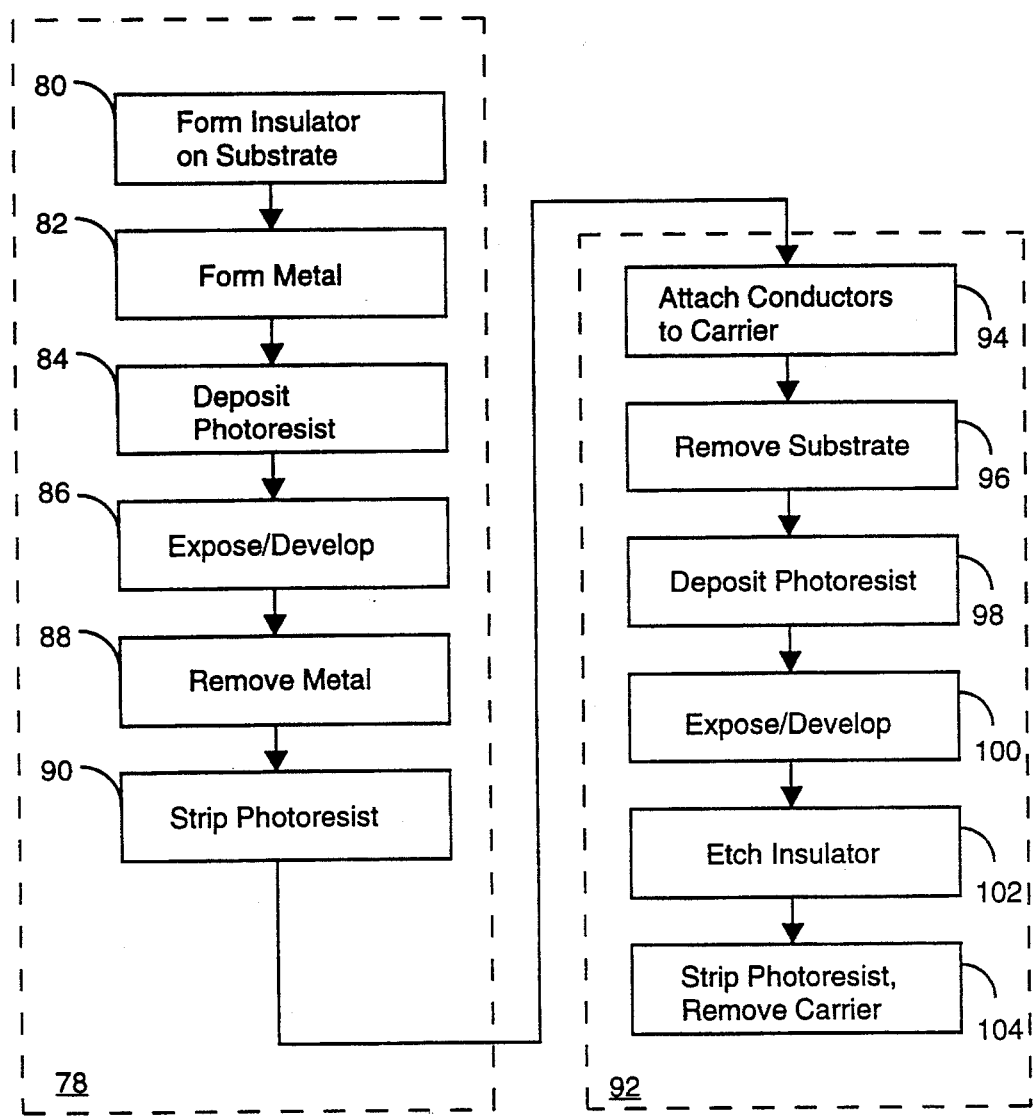
FIG. 6 illustrates an alternate set of processing steps that may be used to from the inorganic chip-to-package interconnection circuit of the invention.

FIG. 6 illustrates an alternate set of processing steps that may be used to form the inorganic chip-to-package interconnection circuit 20 of the invention. The conductor formation steps 78 of this embodiment constitute a subtractive metal process.

The first step of the operation of FIG. 6 is to form an insulator on a substrate (block 80). This step corresponds with block 50 of FIG. 4. Thereafter, metal is formed (block 82) on the insulator, for example, by sputtering. The sputtered metal is typically up to approximately 35 microns thick, but is preferably approximately 18 microns thick. The metal may be aluminum, titanium, copper, nickel, or alloys thereof.

Photoresist is then deposited on the metal (block 84). The photoresist is exposed and developed (block 86) to form the outline for the conductor patterns 22. The metal in the openings of the photoresist is then removed by etching (block 88). Thereafter, the photoresist is stripped (block 90). This results in a substrate with a uniform insulator formed thereon and a set of conductors formed on the uniform insulator. The structure is the same as the structure of FIG. 5, but it does not include the seed layer shown in FIG. 5. The tie bar formation steps 92 follow. Steps 94–104 correspond to steps 64–74 of FIG. 4.

Figure 7:
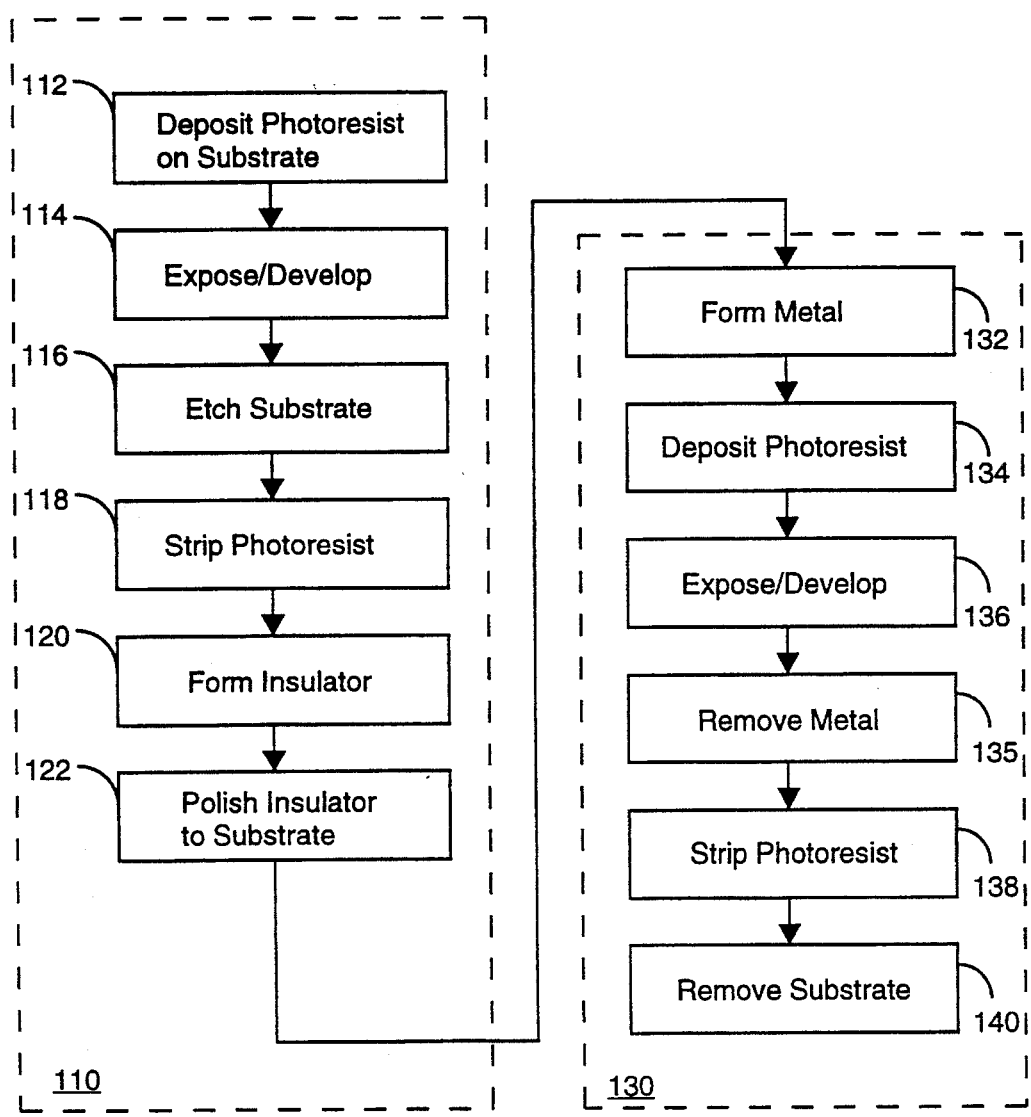
FIG. 7 illustrates another set of processing steps that may be used to form the inorganic chip-to-package interconnection circuit of the invention.

FIG. 7 illustrates yet another set of processing steps that may be used to form the inorganic chip-to-package interconnection circuit 20 of the invention. In this embodiment, the tie bar formation operation 110 is initially performed using an additive process. Thereafter, a conductor formation operation 130 is performed.

The first step associated with the process of FIG. 6 is to deposit photoresist on a substrate (block 112). The substrate will be a semiconductor such as silicon. The photoresist is then exposed and developed (block 114) to form tie bar windows. The substrate is then etched (block 116) through the tie bar windows to form tie bar trenches (between 25 and 50 microns thick) in the substrate. The photoresist is then stripped (block 118).

Figure 8:
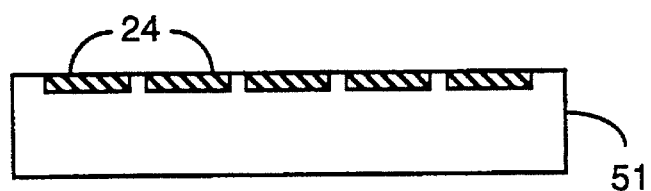
FIG. 8 illustrates the partially formed apparatus of the invention after processing at block 122 of FIG. 7.

An insulator is then formed (block 120), for example by deposition. The insulator is an inorganic substance of the type previously described. This results in the insulator being formed in the tie bar trenches and on the substrate itself. The insulator is then chemically or mechanically polished to the substrate surface (block 122). As a result, the insulator is only in the tie bar trenches formed in the substrate 51, as shown in FIG. 8. Thus, the insulator is now in the form of tie bars 24.

The remaining set of steps constitute a conductor formation operation 130 by the use of a subtractive metal process. The first step is to form metal (block 132) on the substrate over the dielectric tie bar patterns. Photoresist is then deposited on the metal (block 134). The photoresist is then exposed and developed (block 136) to form conductor windows. The metal in the conductor windows is then removed by etching (block 135). Thereafter, the photoresist is stripped (block 138).

Figure 9:
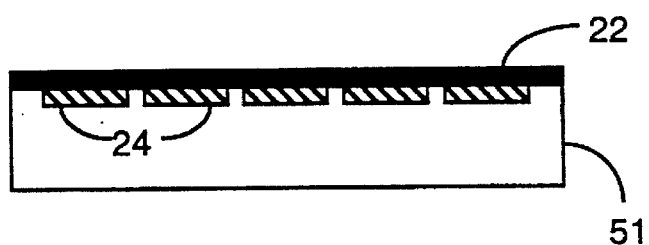
FIG. 9 illustrate the partially formed apparatus of the invention after processing at block 138 of FIG. 7.

At this point, as shown in FIG. 9, there is a substrate 51 with tie bars 24 formed within in it and conductors 22 formed on top of it. The final step is to remove the substrate (block 140), for example by chemically dissolving it. This results in the inorganic chip-to-package interconnection circuit 20 of the invention, shown in FIGS. 1 and 2.

The foregoing descriptions of specific embodiments of the present invention are presented for purposes of illustration and description. They are not intended to be exhaustive or to limit the invention to the precise forms disclosed, obviously many modifications and variations are possible in view of the above teachings. For example, the structure of the invention may originally be formed on a polyimide substrate that is removed by a laser during a final processing step. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:

1. A chip-to-package interconnection circuit comprising:
   a plurality of electrical conductors in a predetermined configuration; and
   a plurality of insulating inorganic tie bars supporting said plurality of electrical conductors in said predetermined configuration, wherein each of said tie bars is between 25 and 50 microns thick.

2. A chip-to-package interconnection circuit comprising:
   a plurality of electrical conductors in a predetermined configuration; and
   a plurality of insulating inorganic tie bars supporting said plurality of electrical conductors in said predetermined configuration, wherein each of said tie bars is between 30 and 70 microns wide.

3. A semiconductor package, comprising:
   a base housing including a first surface and a second surface, said first surface including a semiconductor positioned thereon and electrical contact pads positioned adjacent to said semiconductor, said second surface including external pins, said housing including hermetic feedthroughs electrically connecting said electrical contact pads to said external pins;
   a housing fixture positioned over said first surface of said base housing, said housing fixture defining an interior volume vacuum environment;
   a plurality of electrical conductors positioned within said interior volume vacuum environment, said plurality of electrical conductors electrically connecting said semiconductor and said electrical contact pads; and
   a plurality of insulating inorganic tie bars supporting said plurality of electrical conductors in a predetermined configuration, wherein each of said tie bars is between 25 and 50 microns thick.

4. A semiconductor package, comprising:
   a base housing including a first surface and a second surface, said first surface including a semiconductor positioned thereon and electrical contact pads positioned adjacent to said semiconductor, said second surface including external pins, said housing including hermetic feedthroughs electrically connecting said electrical contact pads to said external pins;
   a housing fixture positioned over said first surface of said base housing, said housing fixture defining an interior volume vacuum environment;
   a plurality of electrical conductors positioned within said interior volume vacuum environment, said plurality of electrical conductors electrically connecting said semiconductor and said electrical contact pads; and
   a plurality of insulating inorganic tie bars supporting said plurality of electrical conductors in a predetermined configuration, wherein each of said tie bars is between 30 and 70 microns wide.

5. A semiconductor package, comprising:
   a base housing including a first surface and a second surface, said first surface including a semiconductor positioned thereon and electrical contact pads positioned adjacent to said semiconductor said second surface including external pins, said housing including hermetic feedthroughs electrically connecting said electrical contact pads to said external pins;
   a plurality of electrical conductors electrically connecting said semiconductor and said electrical contact pads; and
   a plurality of insulating inorganic tie bars supporting said plurality of electrical conductors in a predetermined configuration, wherein each of said tie bars is between 25 and 50 microns thick.

6. A semiconductor package, comprising:
   a base housing including a first surface and a second surface, said first surface including a semiconductor positioned thereon and electrical contact pads positioned adjacent to said semiconductor, said second surface including external pins, said housing including hermetic feedthroughs electrically connecting said electrical contact pads to said external pins;
   a plurality of electrical conductors electrically connecting said semiconductor and said electrical contact pads; and
   a plurality of insulating inorganic tie bars supporting said plurality of electrical conductors in a predetermined configuration, wherein each of said tie bars is between 30 and 70 microns wide.

* * * * *